United States Patent
Yatsuda et al.

(10) Patent No.: US 6,488,863 B2
(45) Date of Patent: Dec. 3, 2002

(54) PLASMA ETCHING METHOD

(75) Inventors: Koichi Yatsuda, Saga (JP); Tetsuya Nishiara, Yokohama (JP); Kouichiro Inazawa, Tokyo (JP); Shin Okamoto, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/970,852

(22) Filed: Oct. 5, 2001

(65) Prior Publication Data

US 2002/0084254 A1 Jul. 4, 2002

Related U.S. Application Data

(63) Continuation of application No. 09/287,343, filed on Apr. 7, 1999, now abandoned, which is a continuation of application No. PCT/JP97/03634, filed on Oct. 9, 1997.

(51) Int. Cl.[7] .................... H01L 21/3065; H01L 21/311
(52) U.S. Cl. ............... 216/72; 216/79; 438/714; 438/732; 438/738; 438/743; 438/744
(58) Field of Search ...................... 216/72, 79; 438/738, 438/743, 744, 732, 714

(56) References Cited

U.S. PATENT DOCUMENTS

| | | | | |
|---|---|---|---|---|
| 4,529,476 A | * | 7/1985 | Kawamoto et al. | 204/192.37 |
| 4,654,114 A | * | 3/1987 | Kadomura | 438/744 |
| 5,002,631 A | | 3/1991 | Giapis et al. | 156/643 |
| 5,173,151 A | * | 12/1992 | Namose | 216/38 |
| 5,188,704 A | * | 2/1993 | Babie et al. | 216/67 |
| 5,356,515 A | * | 10/1994 | Tahara et al. | 156/345 |
| 5,432,107 A | * | 7/1995 | Uno et al. | 438/276 |
| 5,595,627 A | * | 1/1997 | Inazawa et al. | 216/67 |
| 5,716,534 A | | 2/1998 | Tsuychiya et al. | 216/67 |
| 5,786,276 A | * | 7/1998 | Brooks et al. | 438/719 |
| 5,900,660 A | * | 5/1999 | Jost et al. | 257/306 |
| 5,994,227 A | * | 11/1999 | Matsuo et al. | 216/74 |
| 6,033,962 A | * | 3/2000 | Jeng et al. | 438/238 |
| 6,051,504 A | * | 4/2000 | Armacost et al. | 438/706 |

* cited by examiner

Primary Examiner—Anita Alanko
(74) Attorney, Agent, or Firm—Oblon, Spivak, McClelland, Maier & Neustadt, P.C.

(57) ABSTRACT

An etching gas is supplied into a process chamber and turned into plasma so as to etch a silicon nitride film arranged on a field silicon oxide film on a wafer (w). A mixture gas containing at least $CH_2F_2$ gas and $O_2$ gas is used as the etching gas. Parameters for planar uniformity, by which the etching apparatus is set in light of a set value of the planar uniformity, include the process pressure and the mixture ratio ($CH_2F_2/O_2$) of the mixture gas. As the set value of the planar uniformity is more strict, either one of the process pressure and the mixture ratio is set higher.

20 Claims, 5 Drawing Sheets

| | CENTER | EDGE |
|---|---|---|
| SiN ETCHING TIME 30sec | | |
| ETCHING RATE | 230.0 nm/min | 280.0 nm/min |

FIG. 3A

| | CENTER | EDGE |
|---|---|---|
| SiO2 60sec | | |
| ETCHING RATE | 52.5 nm/min | 67.5 nm/min |

FIG. 3B

| | CENTER | EDGE |
|---|---|---|
| Si ETCHING TIME 180sec | | |
| ETCHING RATE | 34.1 nm/min | 42.5 nm/min |

FIG. 3C

PLASMA ETCHING METHOD

This application is a continuation of application Ser. No. 09/287,343, filed on Apr. 7, 1999, abandoned, which is a continuation application of International Application No. PCT/JP97/03634, filed Oct. 9, 1997, the entire contents of which are incorporated herein by reference.

BACKGROUND OF THE INVENTION

1. Field of the Invention

The present invention relates to a plasma etching method for preferentially etching a silicon nitride film (SiNx) arranged on a surface of a target object, such as a semiconductor wafer.

2. Discussion of the Background

In manufacturing processes of semiconductor devices, such as ICs and LSIs, predetermined circuit patterns are formed by subjecting a semiconductor wafer to film formation by means of, e.g., CVD (Chemical Vapor Deposition), and patterning by means of, e.g., etching. There is plasma dry etching as a representative of the etching processes. In plasma dry etching, a patterned photo-resist film is used as a mask and the exposed portion of an objective film is etched by an etching gas which has been turned into plasma.

In plasma dry etching, it is important to set the selectivity of an objective film to be etched, relative to a different kind of film not to be etched, to be as high as possible. Conventionally, a mixture gas of $CHF_3$ gas and $O_2$ gas is used to preferentially etch a silicon nitride film (SiNx) relative to a silicon oxide film ($SiO_2$). This mixture gas is used along with Ar gas, which is a carrier gas. Where the mixture gas of $CHF_3$ gas and $O_2$ gas is used, the selectivity of SiNx relative to $SiO_2$, i.e., (an SiNx etching rate) (an $SiO_2$ etching rate) is about two at most. In this case, the selectivity of SiNx relative to Si, i.e., (an SiNx etching rate) (an Si etching rate) is also about two at most.

Where requirements on line widths and hole diameters are not so strict, a selectivity of about two does not cause serious problems. However, where the line widths and hole diameters are required to be of the sub-micron order, with an increase in the density and integrity degree of semiconductor devices, a selectivity of about two cannot satisfy the requirements.

Jpn. Pat. Appln. KOKAI Publication No. 8-59215 (U.S. Ser. No. 08/189027, now abandoned) discloses an etching method which uses a mixture gas of $CH_xF_{4-x}$ (where x is 2 to 3,) and one or more oxygen-containing gases selected from a group consisting of $O_2$, CO and $CO_2$, in order to preferentially etch silicon nitride relative to silicon oxide, metal silicide, or silicon. In this etching method, preferably, the $CH_xF_{4-x}$ consists essentially of $CHF_3$, the oxygen-containing gas consists essentially of $CO_2$, or both of them, and more preferably, $CO_2$. As a result, this publication states that this etching method improves the selectivity, i.e., (an SiNx etching rate)/(an $SiO_2$ etching rated), to be about four.

On the other hand, in plasma dry etching, it is important to keep the planar uniformity of etching high, the planar uniformity being defined by the difference between processed sizes at the center and the periphery of a target substrate. For example, it can be said that the planar uniformity is preferable where the difference between processed sizes at the center and the periphery falls within a range of ±7%, and more preferably within a range of ±5%. The selectivity and the planar uniformity have a trade-off relationship in terms of a certain parameter. Jpn. Pat. Appln. KOKAI Publication No. 8-59215 described above states a summary account about the selectivity, but does not at all consider the planar uniformity.

SUMMARY OF THE INVENTION

Accordingly, it is an object of the present invention to provide a plasma etching method which can present a good balance between the etching selectivity and the etching planar uniformity of silicon nitride relative to silicon oxide and silicon.

In particular, the present invention provides a method of plasma-etching a target substrate in a plasma etching apparatus, the target substrate having a surface on which a first layer consisting essentially of silicon nitride and a second layer consisting essentially of silicon or silicon oxide are arranged, which entails:

a) setting the etching apparatus in light of a set value of etching selectivity of the first layer relative to the second layer, and a set value of etching planar uniformity defined by a difference between sizes to be processed at a center and a periphery of the target substrate;

b) placing the target substrate in a process chamber of the etching apparatus;

c) supplying a process gas into the process chamber, while exhausting the process chamber, the process gas comprising a mixture gas of $CH_2F_2$ gas and $O_2$ gas at a ratio of from 55% to 100% in volume percentage, the $CH_2F_2$ gas and the $O_2$ gas being mixed at a first mixture ratio ($CH_2F_2/O_2$) of from 0.2 to 0.6 in volume ratio;

d) turning the process gas into plasma by electric discharge, while keeping the process chamber at a first pressure of from 50 mTorr to 100 mTorr; and e) etching the first layer preferentially to the second layer with the plasma; and f) wherein parameters for the planar uniformity, by which the etching apparatus is set in light of the set value of the planar uniformity, include the first pressure and the first mixture ratio, and as the set value of the planar uniformity is more strict, either one of the first pressure and the first mixture ratio is set higher.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3C are cross-sectional photographic views showing etching results according to a method of the present invention;

DETAILED DESCRIPTION OF THE PREFERRED EMBODIMENT

In the present invention, by using the mixture gas $CH_2F_2$ gas and $O_2$ gas, and setting the specific parameters, it is possible to provide a plasma etching method which can present a good balance between the etching selectivity and the etching planar uniformity of silicon nitride relative to silicon oxide and silicon, particularly to silicon oxide. For example, the present invention allows a plasma etching process to be performed with a selectivity ([an $SiN_x$ etching rate]/[an $SiO_2$ etching rate]) of 3.5 or more, and a planar uniformity of within ±7.0%.

Figure 1:
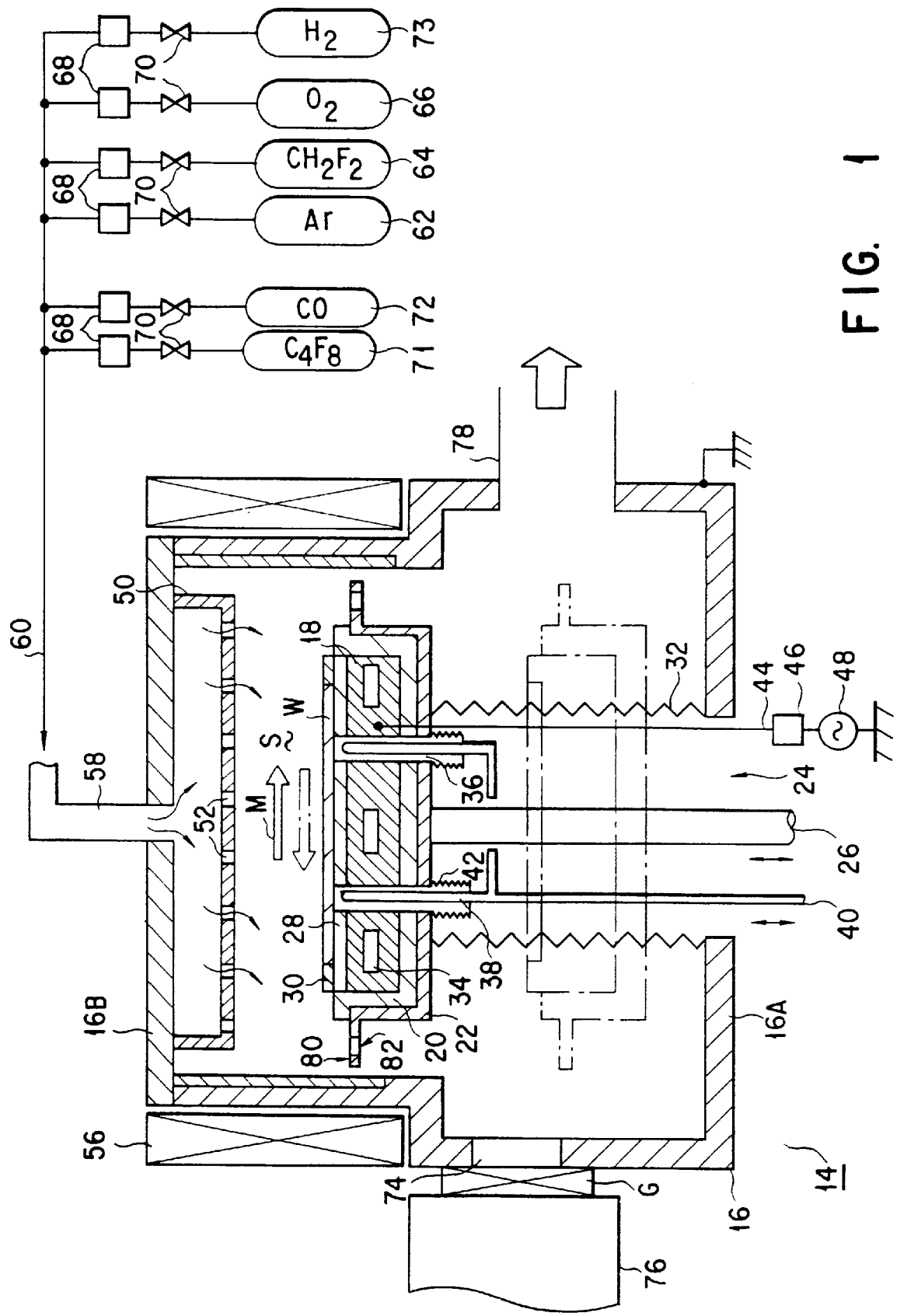
FIG. 1 is a schematic view showing a plasma etching apparatus for performing a plasma etching method according to an embodiment of the present invention.

As shown in FIG. 1, a plasma etching apparatus 14 for performing a method according to the present invention includes a process chamber 16 formed of, e.g., a cylindrical aluminum body. The upper part of the process chamber 16 has a slightly decreased diameter with a step portion, where a ring magnet, described later, is placed. The process chamber 16 is grounded. A circular and flat worktable 18 formed of a conductive material, such as aluminum, is arranged as a lower electrode in the process chamber 16. The worktable 18 is supported by a worktable support 22, which is formed of a conductive material and has a cup like structure, through an insulating member 20 made of, e.g., ceramic.

The bottom of the worktable support 22 is supported by and fixed to the top end of an elevating shaft 26, which is inserted into an opening 24 formed at the center of the bottom 16A of the process chamber.

On the top surface of the worktable 18, there is an electrostatic chuck 28 formed of ceramic or polyimide resin with a conductive plate embedded therein, to which a direct current of high voltage is to be applied. A semiconductor wafer W, i.e., a target object, is attracted and held on the top surface of the electrostatic chuck 28 by means of Coulomb's force.

A focus ring 30 made of, e.g., quartz, is arranged on the periphery of the top surface of the worktable 18 to surround all the circumference of the wafer W on substantially the same horizontal level. The focus ring 30 allows an electric field to be concentrated toward the wafer surface side during a plasma generation.

The bottom side of the worktable support 22 and the peripheral edge of the opening 24 formed in the bottom 16A of the process chamber are airtightly connected by a bellows 32 which is capable of extending and contracting. The bellows 32 allows the worktable 18 to move up and down while keeping the process chamber 16 airtight.

A cooling jacket 34 like a passageway is formed in the worktable 18, so that the wafer W is kept at a predetermined temperature by causing a coolant to flow in the jacket 34. A plurality of lifter holes 36 are vertically formed through the worktable 18 at predetermined positions on the periphery of the worktable 18. Wafer lifter pins 38 are arranged to correspond to the lifter holes 36 and be movable up and down. The lifter pins 38 can be integrally moved up and down by a pin elevating rod 40 which is inserted in the bottom opening 24 and is vertically driven. A metal bellows 42 capable of extending and contracting is arranged between each of the pins 38 and the bottom of the worktable support 22 at a position where the pin 38 penetrates the worktable 22. The bellows 42 allows the pin 38 to move up and down while keeping airtightness. Where the worktable 18 is located at a position indicated with one-dot-chain lines in FIG. 1, the wafer can be lifted up or moved down by means of vertical movement of the pins 38. Generally, four wafer lifter pins 38 are arranged to correspond to the periphery of the wafer.

A lead line 44 is connected to the worktable 18, and is led out to the outside in an insulated state. The lead line 44 is connected through a matching circuit 46 to a radio frequency power supply 46, which outputs a radio frequency power of, e.g., 13.56 MHz, so that the radio frequency power for generating plasma can be applied to the worktable 18.

On the other hand, a shower head 50 like a thin container is arranged on the ceiling 16B of the process chamber 16 to face the worktable 18. The shower head 50 is provide with a number of spouting holes 52 on the bottom surface, i.e., gas spouting surface, for spouting a plasma gas from the head 50 into a processing space S. The shower head 50 is formed of a conductive material, such as aluminum having an anodized surface, so that it functions as an electrode.

A ring magnet 56 is arranged outside the process chamber to be rotatable in the angular direction. The magnet 56 generates a rotational magnetic field M oriented parallel to the wafer surface in the processing space S. The density of plasma can be increased by Lorentz force created between the rotational magnetic field M and the plasma.

The shower head 50 has a gas inlet 58, which is connected to a gas feed pipe 60. The gas feed pipe 60 is divided into several pipes, so that they are connected to an Ar gas source 62, a $CH_2F_2$ gas source 64, an $O_2$ gas source 66, a $C_4F_8$ gas source 71, a CO gas source 72, and an $H_2$ gas source 73, respectively. The Ar gas sent from the gas source 62 is used as an additive gas or carrier gas for dilution. The $CH/F_2$ gas and the $O_2$ gas sent from the gas sources 64 and 66 are used as an etching gas for etching a silicon nitride film. The $H_2$ gas sent from the gas source 73 is used as an additive gas, which is added if necessary. The $C_4F_8$ gas and the CO gas sent from the gas sources 71 and 72 are used as an etching gas for etching a silicon oxide film. These gases are supplied while their flow rates are controlled by mass-flow controllers 68 and switching valves 70 arranged on the way.

A wafer transfer port 74 is arranged on a side wall of the process chamber 16 to correspond to a position where the worktable 18 is moved down. The transfer port 74 is provided with a gate valve G for selectively allowing it to communicate with a load-lock chamber 76, which is capable of being vacuum-exhausted. Further, an exhaust port 78 is formed on a side wall of the process chamber 16 and is connected to a vacuum-exhaust system including a vacuum pump (not shown), etc.

The support 22 of the worktable 18 is provided with a baffle plate 80 extending toward the inner wall of the process chamber. A plurality of baffle holes 82 are formed in the baffle plate 80 for guiding the atmosphere in the processing space S to the exhaust port 78.

An explanation will be given to a plasma etching method using the above described apparatus 14, according to an embodiment of the present invention. The following embodiment is exemplified by a process of forming a contact hole near a field oxide film of a semiconductor device, which has been formed by a LOCOS (Local Oxidation of Silicon) process.

LOCOS processes are performed to form a device isolation region for isolating two device formation regions from each other, or a device formation region and a field region from each other. The device isolation region plays an important role in a MOSLSI and the like. Where a contact hole is formed near the device isolation region by etching, it is necessary, as far as possible, to prevent the silicon oxide film of the device isolation region from being removed by the etching.

Figure 4:
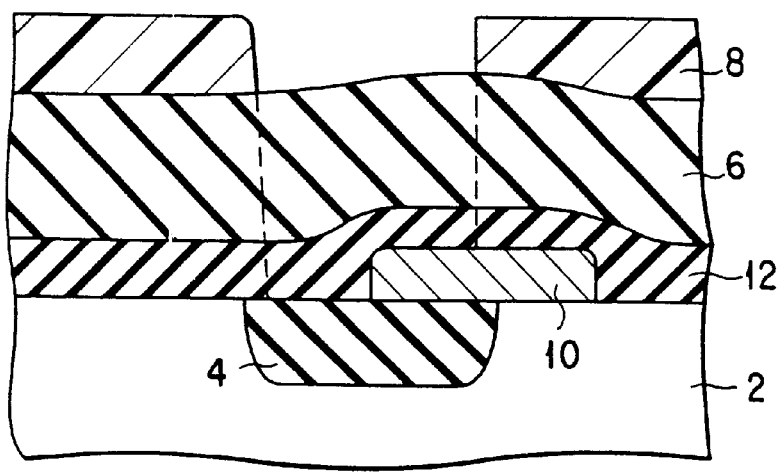
FIG. 4 is an enlarged cross-sectional view showing part of a semiconductor device during a contact hole formation.

FIG. 4 is an enlarged cross-sectional view showing part of a semiconductor device during a contact hole formation. In the step shown in FIG. 4, a silicon substrate 2 is covered overall with a $SiO_2$ insulating film 6 to be an interlevel insulating film. A LOCOS field oxide film 4 is formed on the surface of the silicon substrate 2 to define a device formation region. A wiring layer 10 is extended such that it overlaps the field oxide film 4.

Where the contact hole is formed to the wiring layer 10, a patterned photo-resist layer 8 is formed on the insulating film 6, as shown in FIG. 4. Then, the insulating film 6 is etched, using the photo-resist 8 as a mask.

Since the insulating film 6 and the field oxide film 4 are formed of the same silicon oxide, it is impossible to gain an etching selectivity between the films 6 and 4. Consequently, if the insulating film 6 were to be in direct contact with the field oxide film 4 thereunder, it would be difficult to stop etching without causing damages to the field oxide film 4. For this reason, a silicon nitride film 12, which is made of a different material from silicon oxide, is formed overall before the insulating film 6 is formed on the substrate, though it results in two etching steps.

Specifically, in the first step, the insulating film 6 is etched, using an etching gas, which presents a large etching selectivity of $SiO_2$ relative to SiNx (silicon nitride), i.e., [an $SiO_2$ etching rate]/[an SiNx etching rate]. Then, in the second step, the silicon nitride film 12 is etched, using an etching gas, which presents a large etching selectivity of SiNx (silicon nitride) relative to $SiO_2$, i.e., [an SiNx etching rate]/[an $SiO_2$ etching rate]. As a result, the contact hole is formed toward the wiring layer 10 while making damages to the field oxide film 4 and the Si substrate 2 as small as possible.

More specifically, at first, the plasma etching apparatus 14 is set up in accordance with set values, such as etching rates of the silicon oxide film and the silicon nitride film, an etching selectivity of the silicon nitride film relative to the silicon oxide film, and a planar uniformity of etching defined by the difference between sizes to be processed at the center and the periphery of the wafer, in etching of the first and second steps to be described later. For this purpose, relationships between the set values and adjustable parameters of the etching apparatus 14 are obtained by experiments in advance, and inputted in a CPU. With this operation, the parameters of the apparatus 14 can be automatically adjusted by inputting the set values of etching conditions into the CPU.

The semiconductor wafer W or target object is transferred into the process chamber 16, which has been kept at vacuum, from the load-lock chamber 76 through a wafer transfer port 74. At this time, on the wafer W, the photo-resist layer 8 patterned in accordance with the opening size of the contact hole is arranged on the inter-level insulating film 6, as shown in FIG. 4. The wafer W is mounted on the worktable 18, which has been lowered, as indicated with one-dot chain lines in FIG. 1, and the wafer W is attracted and held by Coulomb's force of the electrostatic chuck 28. Then, the worktable 18 is moved up and positioned at a predetermined process position.

Then, a predetermined process gas is supplied into the process chamber 16 from the shower head 50 while the process chamber 16 is vacuum-exhausted, so that the process chamber 16 is kept at a predetermined process pressure. At the same time, a radio frequency electric field of 13.56 MHz is applied between the upper and lower electrodes, i.e., between the shower head 50 and the worktable 18, thereby turning the process gas into plasma and performing an etching process. In addition, the magnet 56 arranged outside the process chamber 16 is rotated to generate a rotational magnetic field M in the processing space S. By generating the rotational magnetic field M, the plasma can be confined by Lorentz force, so that the plasma density is increased to obtain a high etching rate.

In the first step, the $SiO_2$ insulating film 6 is etched only at the contact hole portion. In this step, a mixture gas of $C_4F_8$ gas and CO gas is used as a process gas along with a carrier gas, such as Ar gas. Assuming that the process chamber 16 has a capacity of from 35 liters to 45 liters, conditions are set such that the process pressure is from 20 mTorr to 60 mTorr, and the flow rates of the $C_4F_8$ gas, CO gas, and Ar gas are from 10 sccm to 20 sccm, 20 sccm to 300 sccm, and 0 sccm to 400 sccm, respectively. Further, the temperature of the upper surface of the worktable 18 is set to be from −30° C. to 30° C.

When the contact hole portion of the insulating film 6 is completely etched by etching of the first step, supplies of the $C_4F_8$ gas and CO gas are stopped. Then, the second step, i.e., etching of the contact hole portion of the silicon nitride film 12 is ready to start.

In the second step, a mixture gas of $CH_2F_2$ gas and $O_2$ gas is used as a process gas along with a carrier gas, such as Ar gas. The $O_2$ gas presents the function of removing deposits at the bottom of the contact hole due to reaction products formed by etching. Assuming that the process chamber 16 has a capacity of from 35 liters to 45 liters, conditions are set such that the process pressure is from 50 mTorr to 100 mTorr, and preferably from 65 mTorr to 100 mTorr. The flow rates of the $CH_2F_2$ gas, $O_2$ gas, and Ar gas are set to be from 20 sccm to 60 sccm, 20 sccm to 100 sccm, and 50 sccm to 300 sccm, respectively. Where the flow rate of the mixture gas is too large, the wafer suffers serious damages. Where the flow rate of the mixture gas is too small, hardly any sufficient etching rate is obtained. Further, the temperature of the upper surface of the worktable 18 is set to be from −30° C. to 30° C.

As described above, in the second step as well, the process gas is supplied into the process chamber 16 from the shower head 50 while the process chamber 16 is vacuum-exhausted, so that the process chamber 16 is kept at a predetermined process pressure. At the same time, a radio frequency electric field of 13.56 MHz is applied between the upper and lower electrodes, i.e., between the shower head 50 and the worktable 18, thereby turning the process gas into plasma and performing an etching process. In addition, the magnet 56 arranged outside the process chamber 16 is rotated to generate a rotational magnetic field M in the processing space S.

By using the mixture gas of $CH_2F_2$ gas and $O_2$ gas as an etching gas, it is possible to greatly improve the selectivity of the silicon nitride film relative to the silicon oxide film and the Si film. For example, this method can improve the selectivity by about two or three times, as compared to a conventional method using $CHF_3$ gas as an etching gas. Consequently, the silicon nitride film 12 is precisely etched only at the contact hole portion shown in FIG. 4, while the field oxide film 4 of $SiO_2$ and the Si substrate 2 are prevented from being etched as far as possible.

Note that, although the above described embodiment employs Ar gas as an additive gas consisting of an inactive gas, this gas may be omitted. Further, in place of Ar gas, another inactive gas, such as $N_2$ gas, Ne gas, He gas, or Xe gas, may be used.

Furthermore, in the above described embodiment, the first step (etching of the silicon oxide film 6) and the second step (etching of the silicon nitride film 12) are sequentially performed in the same process chamber. However, for example, the first step may be performed in another processing apparatus, and only the second step may be performed in the processing apparatus shown in FIG. 1.

An explanation will be given on advantages of using $CH_2F_2$ and $O_2$, with reference to experiment results.

Figure 2A:
FIGS. 2A to 2C are cross-sectional photographic views showing etching results according to a comparative method.
Figure 2B:
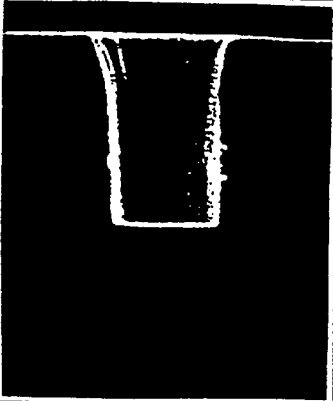
Figure 2C:

FIGS. 2A to 2C are cross-sectional photographic views showing etching results according to a method using $CHF_3$. FIGS. 3A to 3C are cross-sectional photographic views showing etching results according to a method using $CH_2F_2$. These views each show a result when a hole of 0.6 μm-diameter was formed by etching in SiNx, $SiO_2$, and Si. In the views, "CENTER" indicates cases where the hole was positioned almost at the center of the wafer surface, "EDGE" indicates cases where the hole was positioned at the periphery of the wafer surface. Each of the photographic views is provided with its etching time and etching rate.

In the process conditions of the method using $CHF_3$ shown in FIGS. 2A to 2C, the process pressure and the radio frequency power were set at 40 mTorr and 500W, respectively. As the process gas, $CHF_3/Ar/O_2$ was supplied at a flow rate of 20/100/20 sccm. The temperatures in the process chamber were set such that the upper electrode and the side wall was at 60° C. and the lower electrode was 20° C.

In the process conditions of the method using $CH_2F_2$ shown in FIGS. 3A to 3C, the process pressure and the radio frequency power were set at 40 mTorr and 500W, respectively. As the process gas, $CH_2F_2/Ar/O_2$ was supplied at a flow rate of 20/100/20 sccm. The temperatures in the process chamber were set such that the upper electrode and the side wall were at 60° C. and the lower electrode was at 20° C. In other words, the two methods differed only in that the etching gas was $CHF_3$ or $CH_2F_2$.

As shown in FIGS. 2A to 2C, in the method using $CHF_3$, the etching rates of SiNx were higher than those of $SiO_2$ and Si. On average, the etching rates of SiNx, $SiO_2$, and Si were 251.7 nm/min, 118.9 nm/min, and 94.0 nm/min, respectively. Consequently, the selectivities of SiNx relative to $SiO_2$ and Si were about 2.1 and about 2.7, respectively.

On the other hand, as shown in FIGS. 3A to 3C, in the method using $CH_2F_2$, the etching rates of SiNx were high, similarly to the method using $CHF_3$, but the etching rates of $SiO_2$ and Si decreased very much. On average, the etching rates of SiNx, $SiO_2$, and Si were 252.9 nm/min, 65.3 nm/min, and 38.3 nm/min, respectively. Consequently, the selectivities of SiNx relative to $SiO_2$ and Si were about 3.9 and about 6.6, respectively.

As described above, the method using $CH_2F_2$ increased the selectivities of SiNx relative to $SiO_2$ and Si up to about two times those in the method using $CHF_3$. However, under these experimental conditions, the method using $CH_2F_2$ slightly decreased planar uniformity as compared to the method using $CHF_3$.

An explanation will be given on relationships between the selectivity of SiNx relative to $SiO_2$ and the planar uniformity in method according to the present invention.

Figure 5:
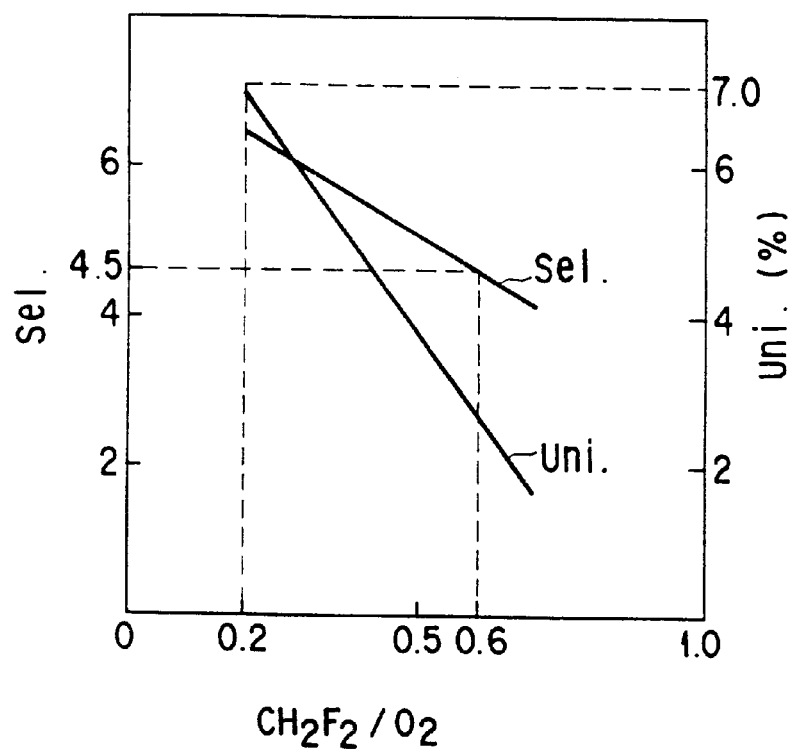
FIG. 5 is a graph showing the relationships of the selectivity (SiNx/$SiO_2$) and the planar uniformity relative to the mixture ratio ($CH_2F_2/O_2$)
Figure 6:
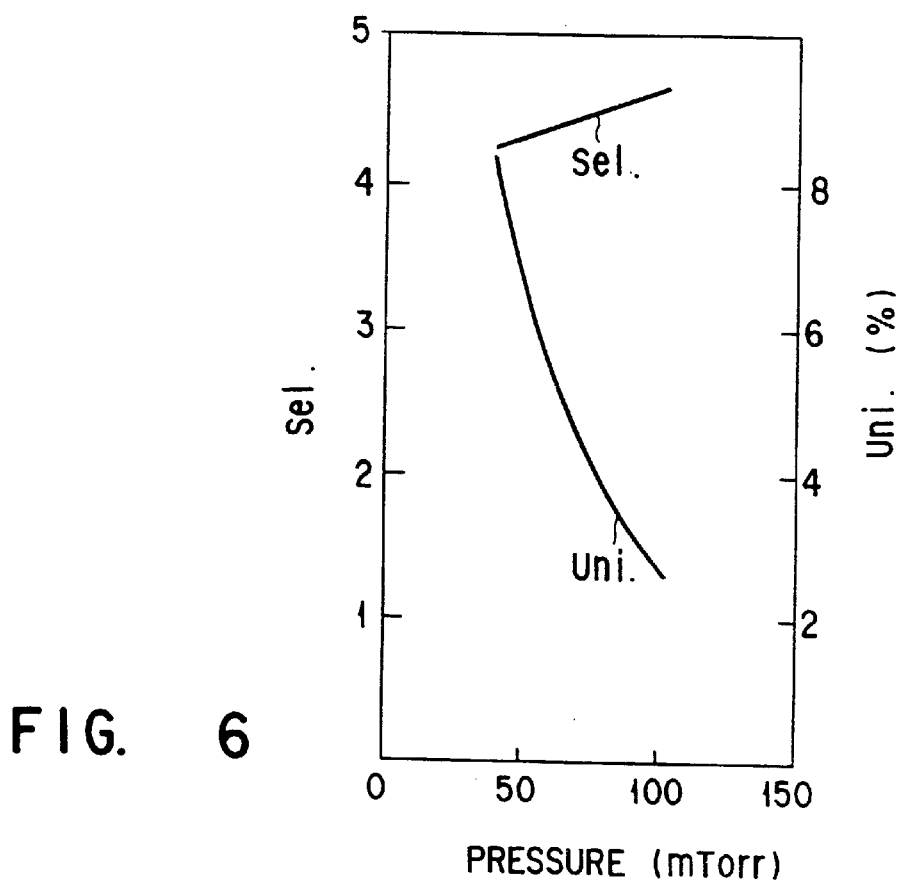
FIG. 6 is a graph showing the relationships of the selectivity (SiNx/$SiO_2$) and the planar uniformity relative to the process pressure.
Figure 7:
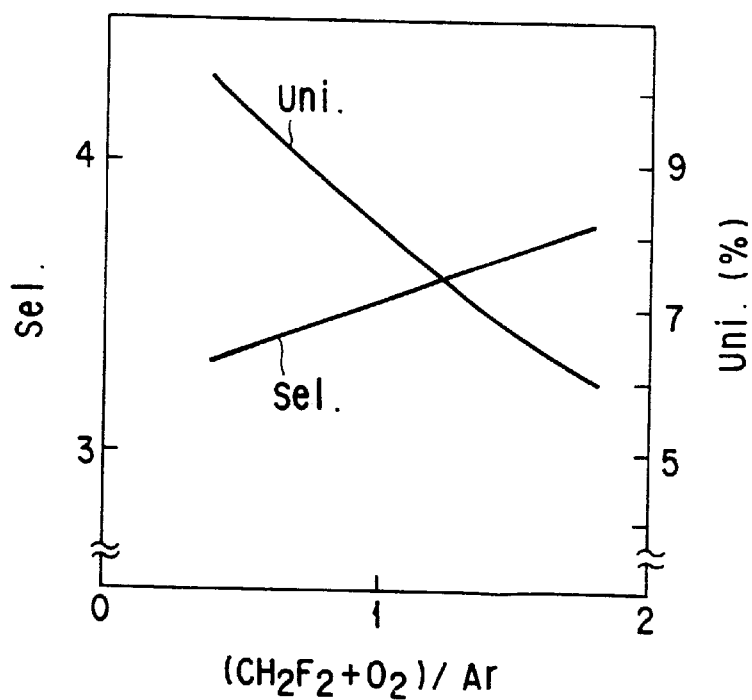
FIG. 7 is a graph showing the relationships of the selectivity ($SiN_x/SiO_2$) and the planar uniformity relative to the mixture ratio (mixture gas/carrier gas).

FIGS. 5 to 7 are graphs showing results of researching relationships of the selectivity ($SiNx/SiO_2$) and the planar uniformity relative to various parameters. In FIGS. 5 to 7, "Sel." and "Uni." denote the selectivity ($SiNx/SiO_2$) and the planar uniformity, respectively. Since "Sel." denotes the selectivity itself, a larger value means a better property. On the other hand, since "Uni." denotes the difference between etched sizes at the center and the periphery of a wafer, a smaller value (absolute value) means a better property.

In the experiments of FIGS. 5 to 7, attention was paid to three parameters, i.e., the mixture ratio ($CH_2F_2/O_2$) between the $CH_2F_2$ gas and $O_2$ gas, the process pressure in the process chamber 16, and the mixture ratio (mixture gas/carrier gas) between the mixture gas (the $CH_2F_2$ gas and $O_2$ gas) and the Ar carrier gas. In common to these experiments, the radio frequency power was set at 500W, and the temperatures in the process chamber were set such that the upper electrode and the side wall were at 60° C. and the lower electrode was at 20° C.

FIG. 5 shows the relationships of the selectivity ($SiNx/SiO_2$) and the planar uniformity relative to the mixture ratio ($CH_2F_2/O_2$). In this experiment, the process pressure and the Ar carrier gas flow rate were set at 100 mTorr and 0 (zero) sccm, respectively. As shown in FIG. 5, where the mixture ratio ($CH_2F_2/O_2$) was from 0.2 to 0.6, the selectivity was 4.5 or more and the uniformity was within ±7%; which is a balanced state between the selectivity and the uniformity more than a conventional method. In this range, the selectivity became better with a decrease in the mixture ratio ($CH_2F_2/O_2$), but the uniformity became better with an increase in the mixture ratio ($CH_2F_2/O_2$). Further, where the mixture ratio ($CH_2F_2/O_2$) was from 0.3 to 0.5, the selectivity was 5.0 or more and the uniformity was within ±6.0%; which are preferable values. Furthermore, where the mixture ratio ($CH_2F_2/O_2$) was from 0.3 to 0.4, the selectivity was 5.0 or more and the uniformity was within ±5.0%; which are more preferable values.

FIG. 6 shows the relationships of the selectivity ($SiNx/SiO_2$) and the planar uniformity relative to the process pressure. In this experiment, the flow rates of the $CH_2F_2$ gas, $O_2$ gas, and Ar carrier gas were set at 60 sccm, 100 sccm, and 0 (zero) sccm, respectively. As shown in FIG. 6, where the process pressure was from 50 mTorr to 100 mTorr, the selectivity was 4.3 or more and the uniformity was within ±7.0%; which is a balanced state between the selectivity and the uniformity more than a conventional method. In this range, both of the selectivity and the uniformity became better with an increase in the process pressure. Further, where the process pressure was from 65 mTorr to 100 mTorr, the uniformity was within ±5.0%; which is a preferable value.

FIG. 7 shows the relationships of the selectivity ($SiNx/SiO_2$) and the planar uniformity relative to the mixture ratio (mixture gas/carrier gas). In this experiment, the process pressure and the mixture ratio ($CH_2F_2/O_2$) were set at 40 mTorr and 1, respectively. As shown in FIG. 7, where the mixture ratio (mixture gas/carrier gas) was 1.3 or more, the selectivity was 3.5 or more and the uniformity was within ±7.0%; which is a balanced state between the selectivity and the uniformity more than in a conventional method. In this range, both the selectivity and the uniformity became better with an increase in the mixture ratio (mixture gas/carrier gas). Note that, as shown in FIGS. 5 and 6, even where no carrier gas was used, excellent results were obtained. From these results, it has been found that a preferable range for the ratio of the mixture gas in the process gas is from about 55% to 100% in volume percentage.

Tables 1 and 2 show a summary of the relationships of the selectivity ($SiNx/SiO_2$) and the planar uniformity relative to the above described parameters, made up from the results of the experiments.

TABLE 1

|  | Selectivity<br>Good–Bad (Influence) |
|---|---|
| $CH_2F_2/O_2$ | Low–High (Large) |
| Process Pressure | High–Low (Small) |
| Mixture Gas/Ar | High–Low (Large) |

TABLE 2

|  | Uniformity<br>Good–Bad (Influence) |
|---|---|
| $CH_2F_2/O_2$ | High–Low (Large) |
| Process Pressure | High–Low (Large) |
| Mixture Gas/Ar | High–Low (Large) |

Accordingly, in consideration of the above-described experiment results, the present invention can provide a plasma etching method of wide use, including a process of forming a contact hole as shown in FIG. 4.

Specifically, there is provided a method of plasma-etching a target substrate in a plasma etching apparatus, the target substrate having a surface on which a first layer consisting essentially of silicon nitride and a second layer consisting essentially of silicon oxide are arranged, comprising the steps of:

setting the etching apparatus in light of a set value of etching selectivity of the first layer relative to the second layer, and a set value of etching planar uniformity defined by a difference between sizes to be processed at a center and a periphery of the target substrate;

placing the target substrate in a process chamber of the etching apparatus;

supplying a process gas into the process chamber, while exhausting the process chamber, the process gas comprising a mixture gas of $CH_2F_2$ gas and $O_2$ gas at a ratio of from 55% to 100% in volume percentage, the $CH_2F_2$ gas and the $O_2$ gas being mixed at a first mixture ratio ($CH_2F_2/O_2$) of from 0.2 to 0.6 in volume ratio;

turning the process gas into plasma by electric discharge, while keeping the process chamber at a first pressure of from 50 mTorr to 100 mTorr; and etching the first layer preferentially to the second layer with the plasma, wherein parameters for the planar uniformity, by which the etching apparatus is set in light of the set value of the planar uniformity, include the first pressure and the first mixture ratio, and as the set value of the planar uniformity is more strict, either one of the first pressure and the first mixture ratio is set higher.

The first pressure is preferably set at a value of from 65 mTorr to 100 mTorr. The first mixture ratio is preferably set at a value of from 0.3 to 0.5, and more preferably a value of from 0.3 to 0.4.

The process gas may further contain a carrier gas of an inactive gas selected from the group consisting of Ar, He, Ne, Xe, and $N_2$. In this case, the parameters for the planar uniformity may further include a second mixture ratio (the mixture gas/the carrier gas). As the set value of the planar uniformity is more strict, any one of the first pressure, the first mixture ratio, and the second mixture ratio is set higher.

Parameters for the selectivity, by which the etching apparatus is set in light of the set value of the selectivity, may also include the first pressure and the first mixture ratio. In this case, as the set value of the selectivity is higher, the first pressure is set higher, or the first mixture ratio is set lower.

The parameters for the selectivity may also further include the second mixture ratio (the mixture gas/the carrier gas). As the set value of the selectivity is higher, either one of the first pressure and the second mixture ratio is set higher, or the first mixture ratio is set lower.

In the step of turning the process gas into plasma by electric discharge, the target substrate is preferably mounted on a worktable set at a temperature of from −30° C. to 30° C. to control the temperature of the target object.

Preferably, the second layer consists essentially of silicon oxide. For example, where a contact hole is formed, the second layer comprises an inter-level insulating film consisting essentially of silicon oxide and arranged on a top side of the first layer, and a field oxide film consisting essentially of silicon oxide and arranged on a bottom side of the first layer. In this case, before the step of supplying a process gas into the process chamber, the method according to the present invention further comprises a step of supplying another process gas containing $C_4F_8$ into the process chamber, while exhausting the process chamber, and turning said other process gas into plasma, thereby plasma-etching the inter-level insulating film to form a hole reaching the first layer in the inter-level insulating film.

Preferably, in the step of etching the first layer preferentially to the second layer with the plasma, a rotational magnetic field is formed in the process chamber to be parallel to the surface of the target substrate, so that the plasma is confined.

Note that the above-described embodiment is exemplified by a reactive ion etching (RIE) apparatus of a dipole type in which the plasma density is increased by applying the rotational magnetic field to the process space S. However, the present invention is not limited to the types of plasma processing apparatuses, but is applicable to apparatuses of any type. For example, the present invention may be applied to a plasma etching apparatus in which a radio frequency power is applied only to the upper electrode, a plasma etching apparatus in which radio frequency powers are applied both of the upper and lower electrodes, or a plasma etching apparatus in which plasma is generated by means of microwaves. Further, the above described embodiment is exemplified by a case where a semiconductor wafer is etched as a target object. The present invention may be applied to cases where a film is formed on a glass substrate, LCD substrate, or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of plasma-etching a target substrate in a plasma etching apparatus, the target substrate having a surface with a first layer consisting essentially of silicon nitride and a second layer consisting essentially of silicon or silicon oxide, the method comprising the steps of:
   a) setting parameters of the etching apparatus;
   b) placing the target substrate in a process chamber of the etching apparatus;

c) supplying a process gas into the process chamber, while exhausting the process chamber;

d) turning the process gas into plasma by electric discharge, while keeping the process chamber at a first pressure; and e) etching the first layer preferentially to the second layer with the plasma, wherein, in order to effect a balance between etching selectivity of the first layer relative to the second layer, and etching planar uniformity, defined by a difference between sizes to be processed at a center and a periphery of the target substrate, the step a) of setting parameters of the etching apparatus is performed in accordance with the following (i) to (iv):

(i) the first pressure is set at a value of from 50 mTorr to 100 mTorr, (ii) the process gas comprises a mixture gas of $CH_2F_2$ gas and $O_2$ gas mixed at a first mixture ratio ($CH_2F_2/O_2$) of higher than 0.2 in volume ratio, (iii) the etching selectivity is set at a value 3.5 or more and the planar uniformity is set at a value within ±7.0%, and (iv) the first pressure and the first mixture ratio are used as parameters of said parameters for the selectivity and the planar uniformity, by which the etching apparatus is set, and the step of setting parameters of the etching apparatus comprises a step of setting the first pressure higher and the first mixture ratio lower, as the set value of the selectivity is higher, and a step of setting the first pressure higher and the first mixture ratio higher, as the set value of the planar uniformity is more strict.

2. The method of claim 1, wherein the process gas further comprises a carrier gas selected from the group consisting of Ar, He, Ne, Xe, and $N_2$ at a second mixture ratio (the mixture gas/the carrier gas).

3. The method of claim 2, wherein the carrier gas is Ar.

4. The method of claim 2, wherein the second mixture ratio is used as a one of said parameters for the selectivity and the planar uniformity, by which the etching apparatus is set, and the step of setting the etching apparatus comprises a step of setting the second mixture ratio higher, as the set value of the planar uniformity is more strict, and a step of setting the second mixture ratio higher, as the set value of the selectivity is higher.

5. The method of claim 1, wherein the process gas comprises the mixture gas of $CH_2F_2$ gas and $O_2$ gas at a ratio of from 55% to 100% in volume percentage.

6. The method of claim 1, wherein the first pressure is set at a value of from 65 mTorr to 100 mTorr.

7. The method of claim 1, wherein the first mixture ratio is set at a value of from 0.2 to 0.6.

8. The method of claim 1, wherein the first mixture ratio is set at a value of from 0.3 to 0.5.

9. The method of claim 1, wherein the first mixture ratio is set at a value of from 0.3 to 0.4.

10. The method of claim 1, wherein, in the step of turning the process gas into plasma by electric discharge, the target substrate is mounted on a worktable set at a temperature of from −30° C. to 30° C. to control the temperature of the target substrate.

11. The method of claim 1, wherein, in the step of etching the first layer preferentially to the second layer with the plasma, a rotational magnetic field is formed in the process chamber to be parallel to the surface of the target substrate, so that the plasma is confined.

12. The method of claim 1, wherein, in the step of etching the first layer preferentially to the second layer with the plasma, a focus ring is arranged to surround the target substrate on substantially the same horizontal level.

13. The method of claim 1, wherein the first layer is disposed on an upper side of the second layer, and is further covered with an upper layer consisting essentially of silicon oxide; and wherein, before the step of supplying a process gas into the process chamber, the method further comprises a step of supplying another process gas comprising $C_4F_8$ gas and CO gas into the process chamber, while exhausting the process chamber, and turning said other process gas into plasma, thereby plasma-etching the upper layer to form a contact hole reaching the first layer in the upper layer.

14. The method of claim 13, wherein said other process gas is turned into plasma at a pressure of from 20 mTorr to 60 mTorr.

15. The method of claim 13, wherein said other process gas further comprises a carrier gas.

16. A method of plasma-etching a target substrate in a plasma etching apparatus, the target substrate having a surface with a second layer consisting essentially of silicon or silicon oxide, a first layer consisting essentially of silicon nitride and disposed on an upper side of the second layer, and an upper layer consisting essentially of silicon oxide and disposed on an upper side of the first layer, the method comprising the steps of:

a) placing the target substrate in a process chamber of the etching apparatus;

b) supplying a first process gas into the process chamber, while exhausting the process chamber, the first process gas comprising $C_4F_8$ and CO gas;

c) turning the first process gas into plasma at a first pressure of from 20 mTorr to 60 mTorr, thereby plasma-etching the upper layer to form a contact hole reaching the first layer in the upper layer;

d) stopping the first process gas, and supplying a second process gas different from the first process gas into the process chamber, while exhausting the process chamber, and keeping the target substrate in the process chamber, the second process gas comprising a mixture gas of $CH_2F_2$ and $O_2$ gas mixed at a first mixture ratio ($CH_2F_2/O_2$) of higher than 0.2 in volume ratio; and e) turning the second process gas into plasma at a second pressure of from 50 mTorr to 100 mTorr, thereby plasma-etching the first layer preferentially to the second layer to form a contact hole in the first layer, which follows the contact hole in the upper layer, wherein etching selectivity of the first layer relative to the second layer is set at a value of 3.5 or more by setting the second pressure higher and the first mixture ratio lower as the selectivity is increased, and etching planar uniformity defined by a difference between sizes to be processed at a center and a periphery of the target substrate is set at a value within ±7.0% by setting the second pressure higher and the first mixture ratio higher as the uniformity is more strict.

17. The method of claim 16, wherein the first process gas further comprises a carrier gas.

18. The method of claim 16, wherein the second process gas further comprises a carrier gas selected from the group consisting of Ar, He, Ne, Xe, and $N_2$.

19. The method of claim 16, wherein the second process gas comprises the mixture gas of $CH_2F_2$ and $O_2$ gas at a ratio of from 55% to 100% in volume percentage.

20. The method of claim 16, wherein the first mixture ratio is set at a value of from 0.2 to 0.6.

* * * * *